(12) United States Patent
Ota

(10) Patent No.: US 7,761,980 B2
(45) Date of Patent: Jul. 27, 2010

(54) METHOD OF MANUFACTURING A WIRING SUBSTRATE FOR EJECTION HEAD

(75) Inventor: Hiroshi Ota, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 1001 days.

(21) Appl. No.: 11/441,140

(22) Filed: May 26, 2006

(65) Prior Publication Data

US 2006/0268047 A1    Nov. 30, 2006

(30) Foreign Application Priority Data

May 30, 2005    (JP) .............................. 2005-157818

(51) Int. Cl.
H01R 43/00    (2006.01)
B41J 2/015    (2006.01)
H05K 1/00    (2006.01)

(52) U.S. Cl. .............................. 29/825; 29/829; 29/830; 29/831; 29/832; 29/890.1; 347/20; 174/250

(58) Field of Classification Search .................. 29/825, 29/829, 846, 830, 831, 832; 347/20, 54; 174/250, 255, 256; 257/773, 774

See application file for complete search history.

(56) References Cited

U.S. PATENT DOCUMENTS

| | | | | |
|---|---|---|---|---|
| 5,363,550 A | * | 11/1994 | Aitken et al. | 29/828 |
| 6,235,624 B1 | * | 5/2001 | Sasaki et al. | 438/618 |
| 6,620,731 B1 | * | 9/2003 | Farnworth et al. | 438/667 |
| 6,621,207 B2 | * | 9/2003 | Uda et al. | 313/485 |
| 2005/0072595 A1 | | 4/2005 | Cho | |

FOREIGN PATENT DOCUMENTS

| | | |
|---|---|---|
| JP | 05-041574 | 2/1993 |
| JP | 08-023153 | 1/1996 |
| JP | 2000-236145 | 8/2000 |
| JP | 2001-320150 A | 11/2001 |
| JP | 2002-353219 | 12/2002 |
| JP | 2004-356255 A | 12/2004 |
| JP | 2005-109505 | 4/2005 |

OTHER PUBLICATIONS

Japanese Office Action ("Notice for Reasons for Rejection") issued on May 31, 2010 and English translation of same.

* cited by examiner

*Primary Examiner*—Derris H Banks
*Assistant Examiner*—Tai Nguyen
(74) *Attorney, Agent, or Firm*—Birch, Stewart, Kolasch & Birch, LLP

(57) ABSTRACT

The method manufactures a wiring substrate. The method comprises: a recess section forming step of forming recess sections corresponding to a prescribed wiring pattern, on a substrate; a filling step of filling a conductive paste containing thinner, into the recess sections; a curing step of causing the conductive paste filled in the recess sections in the filling step to contract, by drying and curing; and a plating step of forming a wiring conductor serving as the wiring pattern, by performing a plating process using the conductive paste in contact with at least a portion of an inner circumferential face of the recess sections, as at least one of a catalyst and a current feed layer.

11 Claims, 12 Drawing Sheets

MAIN SCANNING DIRECTION

PAPER CONVEYANCE DIRECTION (SUB-SCANNING DIRECTION)

MAIN SCANNING DIRECTION

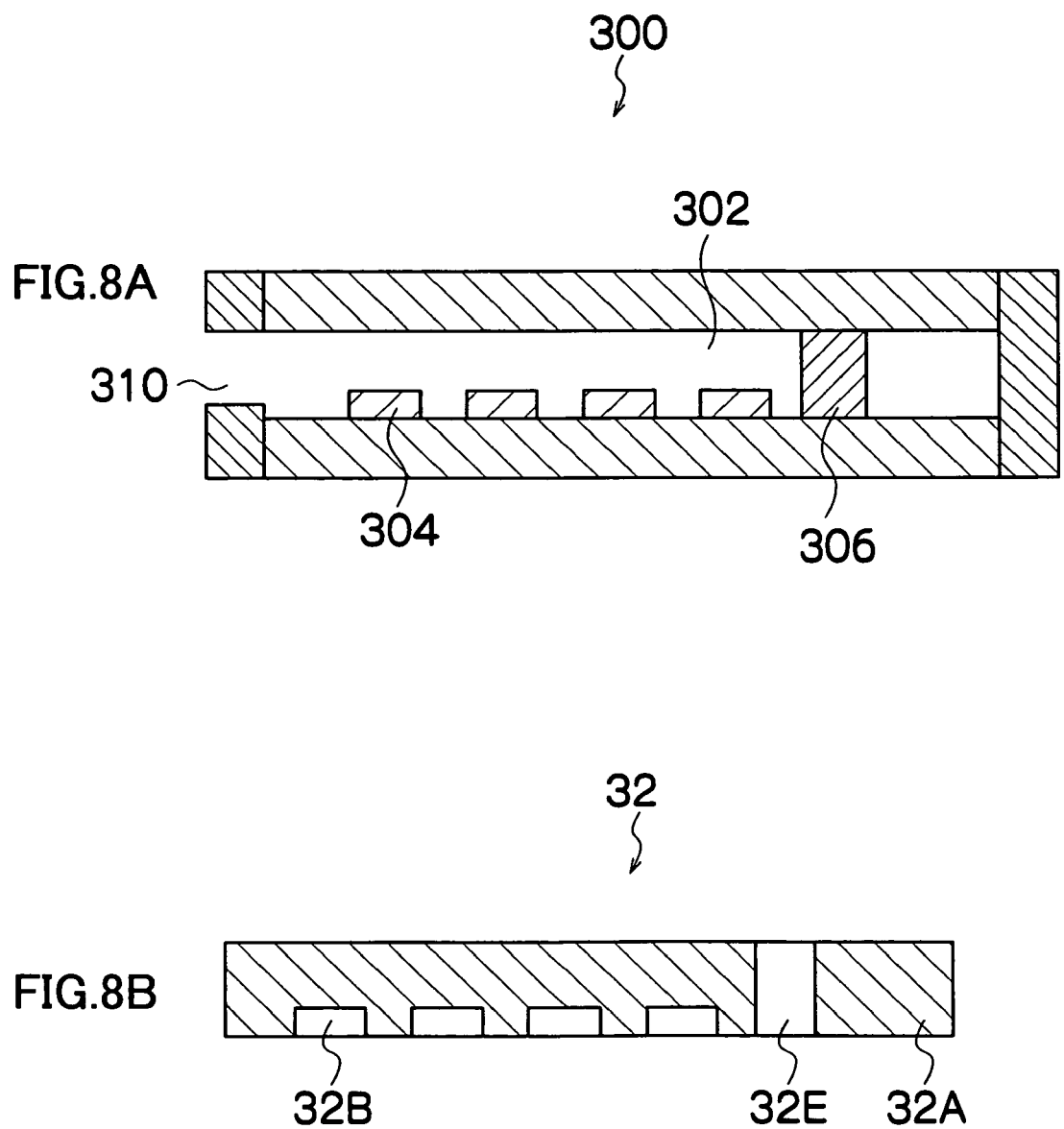

METHOD OF MANUFACTURING A WIRING SUBSTRATE FOR EJECTION HEAD

BACKGROUND OF THE INVENTION

1. Field of the Invention

The present invention relates to a method of manufacturing a wiring substrate, and to an ejection head and image forming apparatus, and more particularly, to electrical wiring technology in an ejection head which ejects liquid from nozzles.

2. Description of the Related Art

In an inkjet recording apparatus, it is essential to provide a large number of nozzles ejecting liquid and to arrange these nozzles at high density, in order to achieve high-speed recording and high quality of the recorded image, and hence ejection heads having a large number of nozzles arranged in a matrix configuration have been proposed. If the nozzles are arranged at high density, then this means that the ejection force generating elements, which are provided to respectively correspond to the nozzles, are also arranged at high density, and the wiring conductors transmitting drive signals to be applied to the ejection force generating elements are also arranged at high density. If the wiring density of the wiring conductors is increased, then the width and surface area of the wiring conductors decrease and the adhesive force (bonding force) decreases between the wiring conductors and the substrate on which the wiring conductors are formed, so that a problem of reduced bonding reliability arises. Therefore, various methods have been proposed for ensuring a prescribed adhesive force between the substrate and the wiring conductors, when forming a wiring pattern comprising the wiring conductors on the substrate.

Japanese Patent Application Publication No. 2001-320150 discloses that a wiring pattern is transferred onto the surface of a substrate by using a stamper having an inverse pattern of recesses and projections with respect to the wiring pattern, and the wiring pattern having grooves of 30 μm width or less is formed.

Japanese Patent Application Publication No. 2004-356255 discloses that a metal mold having a prescribed pattern is manufactured by performing ultrafine mold processing in a metal material, and a non-conductive substrate having a groove-shaped pattern is manufactured by transferring this mold, whereupon conductive material is injected into the groove-shaped pattern formed in the substrate in such a manner that wires are formed on the substrate.

In general, as the method for forming wiring conductors in a groove-shaped pattern formed on a substrate, it is common to use a method for filling a conductive paste into the groove-shaped pattern, since the forming procedure is simple. If wiring conductors are formed by filling a conductive paste into the groove-shaped pattern, then the impedance (specific resistance) of the wiring conductors is ten times or greater than the impedance when wiring conductors are formed by a plating method, or the like. The wiring conductors (the wiring pattern) having a large wiring impedance is problematic in that it degrades the electrical characteristics of the transmitted signal (noise tolerance characteristics, frequency characteristics, and the like).

Here, to give examples of the relationship between the type of wiring material and the specific resistance (unit: Ω·cm), if pure copper is used as the wiring material, then the specific resistance is 1.68 μΩ·cm. Copper wiring formed by electrodeposition from an acidic bath of low organic concentration has the specific resistance of 1.72 μΩ·cm, and copper wiring formed by electrodeposition from a standard acidic bath has the specific resistance of 1.78 μΩ·cm. If an electroless copper plating film is used as the wiring material, then the specific resistance is 2 μΩ·cm to 3 μΩ·cm. On the other hand, if a conductive paste (conductive copper paste) is used as the wiring material, then the specific resistance is 30 μΩ·cm to 40 μΩ·cm.

In the wire formation disclosed in Japanese Patent Application Publication No. 2001-320150, a step is required for removing the conductive film between adjacent wires (on the projecting sections formed on the substrate). If polishing is used as the method for removing the conductive film, then the end sections of the substrate become dulled, and it is difficult to achieve uniform polishing of the substrate, especially in the case of a substrate having a large surface area. In particular, if wiring conductors (a wiring pattern) are formed on a structure having a complicated shape, then it is difficult to remove the unwanted conductive film in a uniform manner by polishing. Furthermore, it is also necessary to dispose of sludge generated during the polishing.

In the wire formation disclosed in Japanese Patent Application Publication No. 2004-356255, if an inkjet head, or the like, is used when injecting the conductive material into the groove-shaped pattern, then a solvent is required in which the conductive material can be contained in order to be ejected from the inkjet head. Consequently, the amount of conductive material injected into the groove-shaped pattern in each operation is reduced, and in order to achieve prescribed wiring impedance, it is necessary to repeat the injection of the conductive material into the groove-shaped pattern, a plurality of times.

SUMMARY OF THE INVENTION

The present invention has been contrived in view of the aforementioned circumstances, an object thereof being to provide a method of manufacturing a wiring substrate, and a liquid ejection head and an image forming apparatus, whereby a high-density wiring pattern of low impedance can be formed with good productivity.

In order to attain the aforementioned object, the present invention is directed to a method of manufacturing a wiring substrate, comprising: a recess section forming step of forming recess sections corresponding to a prescribed wiring pattern, on a substrate; a filling step of filling a conductive paste containing thinner, into the recess sections; a curing step of causing the conductive paste filled in the recess sections in the filling step to contract, by drying and curing; and a plating step of forming a wiring conductor serving as the wiring pattern, by performing a plating process using the conductive paste in contact with at least a portion of an inner circumferential face of the recess sections, as at least one of a catalyst and a current feed layer.

According to the present invention, a conductive paste containing thinner is filled into recess sections formed on a substrate in accordance with a prescribed wiring pattern, and once the conductive paste has contracted due to drying and curing, a plating process is carried out, using the conductive paste as a catalyst or a current feed layer, thereby forming a wiring conductor which serves as a wiring pattern, on top of the conductive paste. Therefore, it is possible to achieve lower impedance in the wiring pattern, in comparison with a case where a wiring pattern is formed on the substrate by using conductive paste only.

Furthermore, since the substrate is composed in such a manner that the conductive paste is filled in the recess sections formed so as to correspond to the wiring pattern, there is no requirement for a mask during filling of the conductive paste, and furthermore, by using the conductive paste containing thinner, it is possible to ensure sufficient space in which wiring conductors can be formed inside the recess sections, when the conductive paste contracts due to drying and curing.

In other words, it is possible to simplify the manufacturing steps for forming very fine wiring patterned to a high density, on a wiring substrate, and a desirable wiring pattern can be formed on the wiring substrate.

One mode of a curing step for causing the conductive paste containing thinner in the recess sections to contract by drying and curing is to dry the conductive paste by heating. Furthermore, in the plating step, it is possible to adopt electroless plating which uses the cured conductive paste as a catalyst, or electrolytic plating which uses the cured conductive paste as a current feed layer (seed layer). An electrolytic plating step in which an electrolytic plating process is carried out by using the cured conductive paste as a current feed layer comprises: a current feed section forming step of forming a current feed section; and a current feed section removal step of removing the current feed section after formation of the wiring conductor.

Preferably, in the recess section forming step, the recess sections are integrally cast with the substrate when the substrate is cast from resin by using a mold.

According to this aspect of the present invention, it is possible to form a substrate and recess sections simultaneously, by means of integral casting of resin using a mold, and therefore, the recess sections can be formed in the same step as the formation of the substrate, which can be expected to help to simplify the manufacturing steps and facilitate the manufacturing process. Furthermore, since a mold is used, it is possible to form recess sections in irregularly shaped substrates which have a complicated shape, and it is also possible to ensure high dimensional accuracy in the formation of the substrate and the recess sections.

In order to attain the aforementioned object, the present invention is also directed to a wiring substrate, comprising: recess sections which are patterned in prescribed shapes; conductive paste which has been caused to contract by drying and curing after being filled in the recess sections and makes contact with at least a portion of an inner circumferential face of the recess sections; and a wiring pattern which has a wiring conductor formed by using the conductive paste cured inside the recess sections, as at least one of a catalyst and a current feed layer.

According to the present invention, it is possible to form a wiring pattern of low impedance, which is suitable for fine wiring patterned to a high density, in a substrate.

A resin material, such as glass epoxy, polyimide, or the like, is suitable for use as the base material (insulating section) of the substrate. Substrates include single-face substrates or double-face substrates, in which the wiring pattern is formed on one face or both faces of the base material, and multiple-layer substrates in which the wiring patterns (conductive layers) and base material (insulating layers) are layered in alternating fashion. The present invention may be applied to any of these types of substrate. Furthermore, a heat radiating member (heat radiating layer) such as ceramic, or metal, having a relatively high thermal conductivity compared to the base material may also be provided.

Preferably, the recess sections have a fine undulating shape at least in a portion thereof that makes contact with the conductive paste which has been caused to contract by drying and curing.

According to this aspect of the present invention, by forming a fine undulating shape in at least the portions of the recess sections which make contact with the conductive paste which is caused to contract by drying and curing, the adhesion between the recess sections and the cured conductive paste is enhanced, and the bonding reliability of the wiring pattern formed in accordance with the recess sections can be improved.

The fine undulating shape formed in the recess sections should be formed at least on the bottom faces of the recess sections, and a desirable mode is one in which the fine undulating shape is formed on all of the surfaces constituting the recess sections, including the bottom faces thereof. The undulating shape formed on the bottom face and side faces of the recess sections should be formed on at least a portion of these faces, and more desirably, it should be formed over the whole of these faces.

The undulating shape may be formed by post processing after forming the recess sections, or, in a mode where the recess sections are formed by casting, it may be formed by using a mold formed with a very fine undulating shape in the sections corresponding to the regions of the recess sections where the undulating shape is to be formed.

In order to attain the aforementioned object, the present invention is also directed to a liquid ejection head, comprising: nozzles which eject liquid toward a recording medium; pressure chambers which accommodate the liquid to be ejected from the nozzles; ejection force generating devices which apply an ejection force to the liquid accommodated in the pressure chambers; and a wiring substrate which includes the above-described wiring substrate and transmits drive signals to be applied to the ejection force generating devices.

In a matrix head in which a large number of nozzles for ejecting liquid are arranged in a two-dimensional configuration, the nozzle arrangement density increases with increase in the number of nozzles, and the ejection force generating devices provided to correspond with the respective nozzles are arranged at high density. Therefore, in a wiring substrate formed with a wiring pattern that transmits a drive signal to the respective ejection force generating devices, it is necessary to form a very fine wiring pattern to a high density. The present invention is able to achieve significant beneficial effects when applied to a matrix head in which a large number of nozzles are arranged at high density in this way.

The ejection head may be a line type head having a row of ejection holes of a length corresponding to the full width of the recording medium (the width of the possible image formation region of the recording medium), or a serial head which uses a short head having an ejection hole row of a length that does not reach the full width of the recording medium, and which scans this head in the breadthways direction of the recording medium.

A line ejection head may be formed to a length corresponding to the full width of the recording medium by combining short head having rows of ejection holes which do not reach a length corresponding to the full width of the recording medium, these short heads being joined together in a staggered matrix fashion.

In order to attain the aforementioned object, the present invention is also directed to an image forming apparatus, comprising the above-described ejection head.

According to the present invention, a conductive paste using a diluting solvent is filled into recess sections formed in a substrate in accordance with a prescribed wiring pattern, and once the conductive paste has cured, a plating process is carried out on top of the conductive paste, using the conductive paste as a seed layer, thereby forming a wiring conductor which creates a wiring pattern. Therefore, it is possible to achieve lower impedance in the wiring pattern, in comparison with a case where a wiring pattern is formed on the substrate chiefly by using conductive paste.

Furthermore, it is possible to simplify the manufacturing process for forming a very fine wiring pattern of low impedance arranged at high density, on a substrate, and hence a desirable wiring pattern can be formed on a wiring substrate.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein:

FIGS. 8A and 8B are diagrams showing a third embodiment of the present invention;

DETAILED DESCRIPTION OF THE PREFERRED EMBODIMENTS

Structure of Head

Figure 1A:
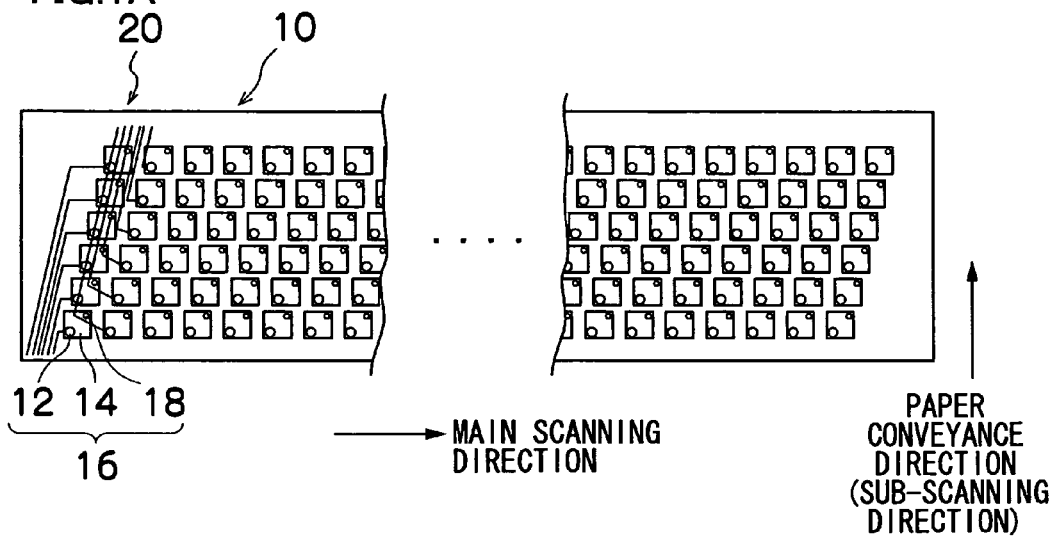
FIGS. 1A to 1C are plan view perspective diagrams showing the composition of a print head according to an embodiment of the present invention.
Figure 1B:
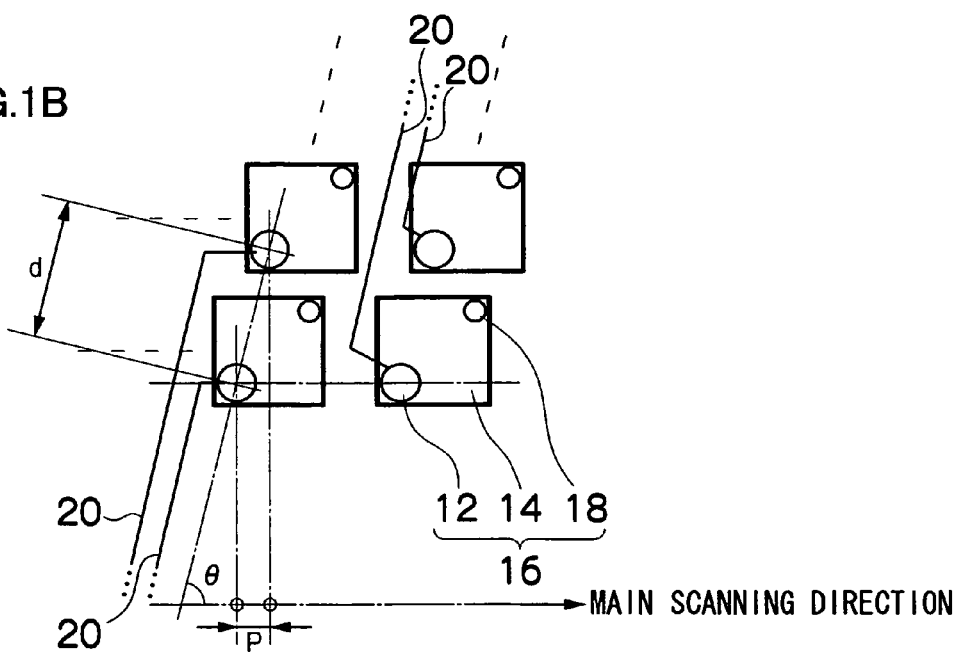

FIG. 1A is a plan view perspective diagram showing the structure of an ejection head according to an embodiment of the present invention, and FIG. 1B is an enlarged diagram showing a portion of same. Furthermore, FIG. 1C is a plan view perspective diagram showing a further embodiment of the structure of an ejection head.

Figure 1C:
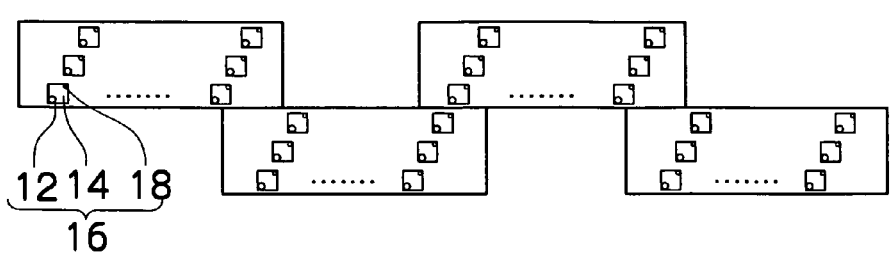

The ejection head 10 (10') shown in FIGS. 1A to 1C may be an inkjet head, or the like, installed in an inkjet recording apparatus, for example. The inkjet head forms dots on a recording medium by ejecting liquid, such as ink and treatment liquid, onto the recording medium, and a prescribed image is formed on the recording medium by combining these dots. In the present embodiment, the inkjet head installed in the inkjet recording apparatus is described as one embodiment of the ejection head. Hereinafter, the ejection head (inkjet head) 10 may be referred to as simply the "head 10".

The head 10 shown in FIG. 1A has a length corresponding to the maximum width of the recording medium, being a full-line head having a plurality of nozzles for ink ejection arranged on a nozzle surface, through a length exceeding at least one edge of the maximum-size recording medium (the full width of the printable range), and in the inkjet recording apparatus provided with this type of head 10, a plurality of heads 10 are arranged to correspond to respective colors, and a color image can be formed on a recording medium by ejecting inks of different colors, respectively, from the heads 10 corresponding to the respective colors, while conveying the recording medium.

By adopting a configuration in which the full line heads 10 having nozzle rows covering the full paper width are provided for the separate colors, it is possible to record an image on the full surface of the recording paper by performing just one operation of relatively moving the recording medium and the heads 10 in the paper conveyance direction (the sub-scanning direction) (in other words, by means of one sub-scanning action). Higher-speed printing is thereby made possible and productivity can be improved in comparison with a shuttle type head configuration in which recording heads moves back and forth reciprocally in the main scanning direction, which is perpendicular to the paper conveyance direction.

In order to arrange the dots formed on the recording medium at a high resolution, the head 10 shown in FIG. 1A has a structure in which a plurality of ejection elements 16, each including a nozzle 12 forming an ink droplet ejection aperture, a pressure chamber 14 corresponding to the nozzle 12, and the like, are disposed two-dimensionally in the form of a staggered matrix, and hence the effective nozzle interval (the projected nozzle pitch) as projected in the lengthwise direction of the head (the direction perpendicular to the paper conveyance direction) is reduced (high nozzle density is achieved).

In other words, as shown in FIG. 1B, the high-density-nozzle head according to the present embodiment is achieved by arranging the plurality of nozzles 12 (ejection elements 16) in a lattice configuration, according to a fixed arrangement pattern following a row direction, which is aligned with the main scanning direction, and an oblique column direction, which forms a prescribed non-perpendicular angle θ with respect to the main scanning direction.

More specifically, by adopting a structure in which the plurality of ejection elements 16 are arranged at a uniform pitch d in line with a direction forming an angle of θ with respect to the main scanning direction, the pitch P of the nozzles 12 projected to an alignment in the main scanning direction is d×cos θ, and hence it is possible to treat the nozzles 12 as if they are arranged linearly at a uniform pitch of P. By means of this composition, it is possible to achieve a nozzle composition of high density, in which the nozzle columns projected to an alignment in the main scanning direction reach a total of 2400 nozzles per inch.

When implementing the present invention, the arrangement structure of the nozzles is not limited to the embodiment shown in the drawings, and it is also possible to apply various other types of nozzle arrangements, such as an arrangement structure having one nozzle row in the sub-scanning direction. The mode of forming one or more nozzle rows through a length corresponding to the entire width of the recording medium in the main scanning direction, which is substantially perpendicular to the conveyance direction of the recording medium (paper feed direction), is not limited to the embodiment described here. For example, instead of the composition in FIG. 1A, as shown in FIG. 1C, a line head having nozzle rows of a length corresponding to the entire width of the recording medium can be formed by arranging and combining, in a staggered matrix, short head blocks 10' each having a plurality of nozzles 12 arrayed in a two-dimensional fashion.

The pressure chamber 14 provided corresponding to each of the nozzles 12 is approximately square-shaped in plan view, and the nozzle 12 and a supply port 18 are provided respectively at either corner of a diagonal of the pressure chamber 14. The pressure chambers 14 are each connected to a common flow channel 30 (not shown in FIG. 1A, but shown in FIG. 2) through the supply port 18. The common flow channel 30 is connected to an ink supply tank 60 (not shown in FIG. 1A, but shown in FIG. 11), which forms an ink source, and ink supplied from the ink supply tank 60 is distributed and supplied to the respective pressure chambers 14 through the common flow channel 30.

Figure 12:
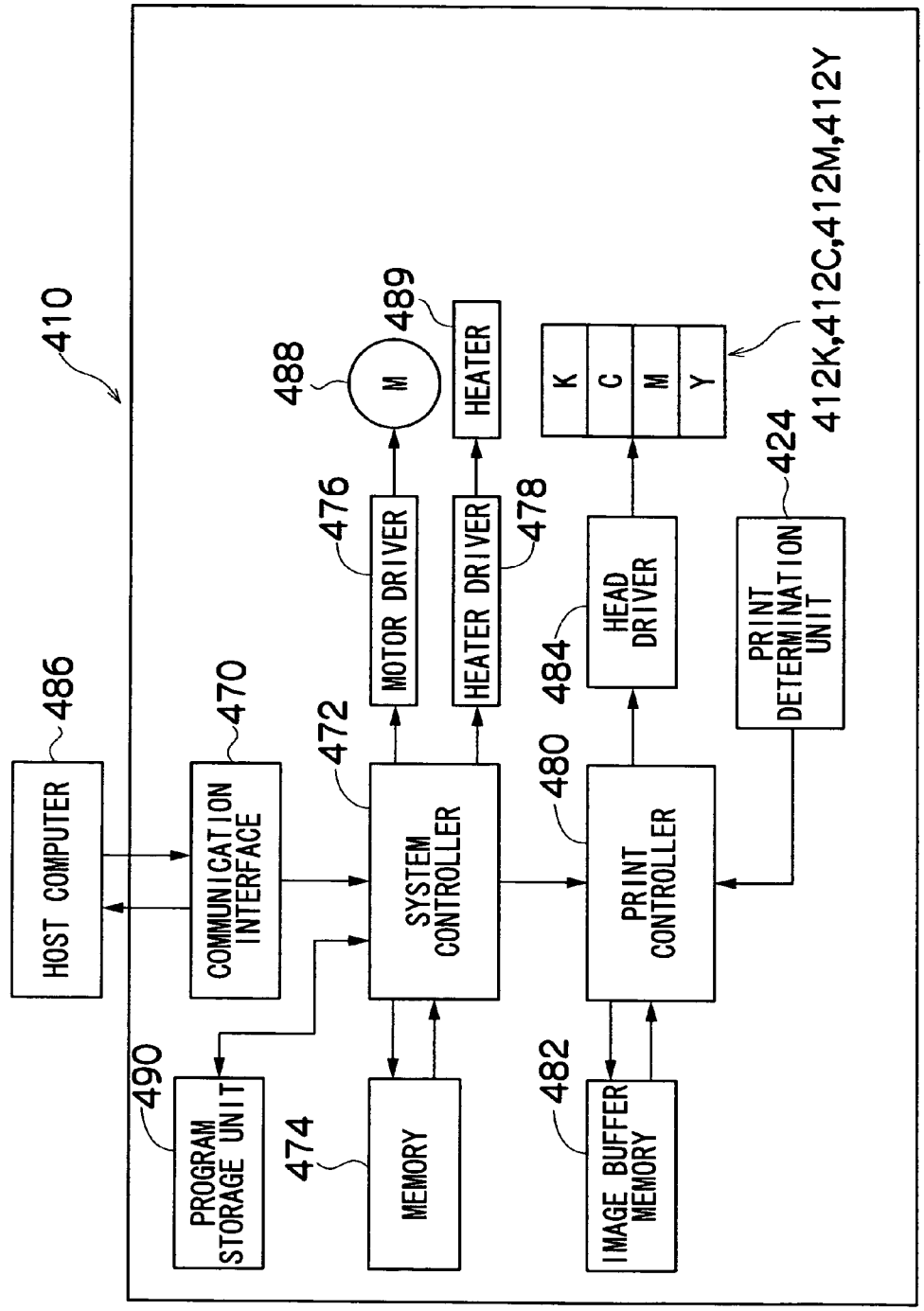
FIG. 12 is a principal block diagram showing the system configuration of the inkjet recording apparatus shown in FIG. 10.

Furthermore, actuators 28 (not shown in FIG. 1A, but shown in FIG. 2) for applying an ejection force to the ink inside the pressure chambers 52, are provided in the ejection elements 16, and the actuators 28 are driven by drive signals transmitted from a control system (see FIG. 12). A wiring substrate 32 (not shown in FIG. 1A, but shown in FIG. 2) having a wiring pattern 20 for transmitting the drive signals is provided in the head 10.

The wiring pattern 20 is formed to correspond to the actuators, in a horizontal plane that is substantially parallel to the plane in which the actuators are disposed. A portion of the wiring pattern 20 is shown in FIG. 1A. The wiring pattern 20 is formed on the wiring substrate 32 having the horizontal plane substantially parallel to the plane in which the actuators are disposed.

As shown in FIG. 1A, the wiring pattern 20 formed so as to correspond to the high-density arrangement of respective ejection elements 16 (actuators) is formed at high density, to very fine dimensions, on the horizontal surfaces (the wiring pattern formation surfaces 32C and 32D in FIG. 2) of the wiring substrate 32. In general, when the wiring pattern is formed very finely, then the impedance of the wiring pattern increases and this affects the electrical characteristics of the drive signal (namely, the frequency characteristics, S/N (signal to noise) ratio, and the like). Moreover, since the surface area of the bonding section between the wiring pattern and the wiring substrate is small, then a problem arises in that the bonding force between the wiring substrate and the wiring pattern is reduced.

As described in detail below, the wiring substrate provided in the inkjet head according to the present embodiment is composed in such a manner that the creation of high impedance in the wiring pattern is suppressed, and the wiring substrate and the wiring pattern are bonded with a sufficient bonding force.

Figure 2:
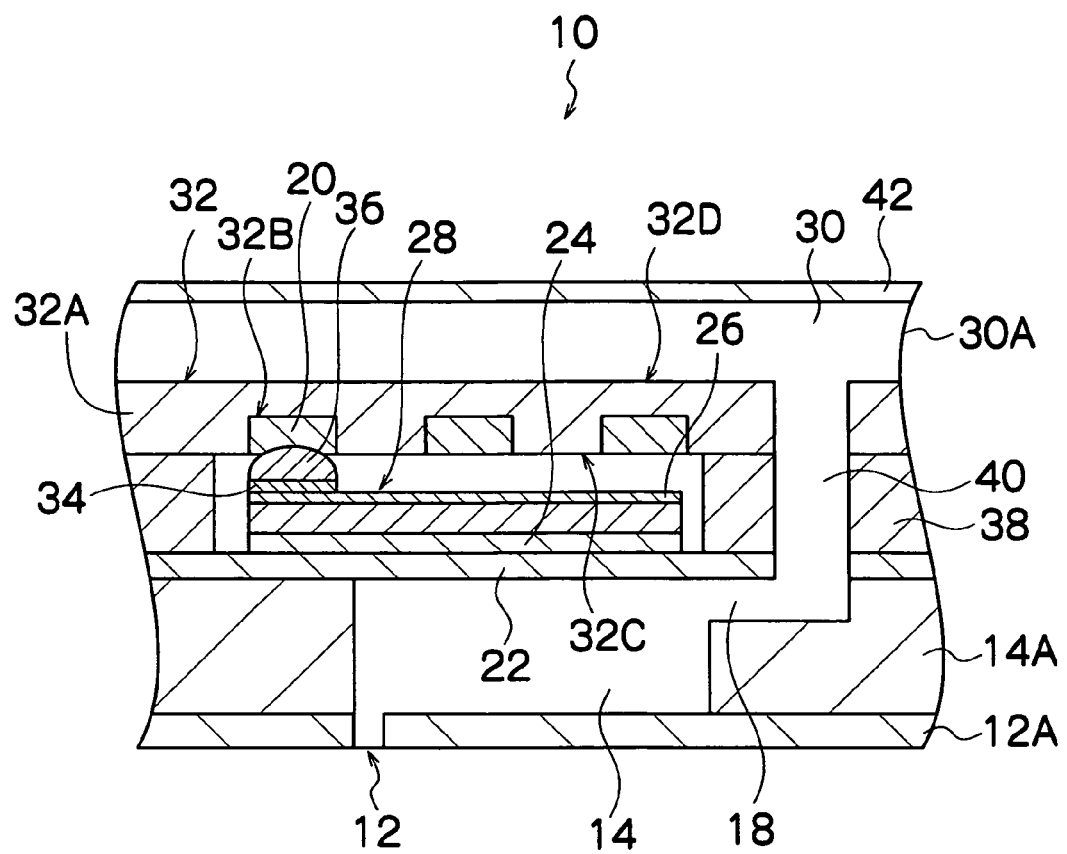
FIG. 2 is a cross-sectional diagram showing the three-dimensional structure of the head.
Figure 3:
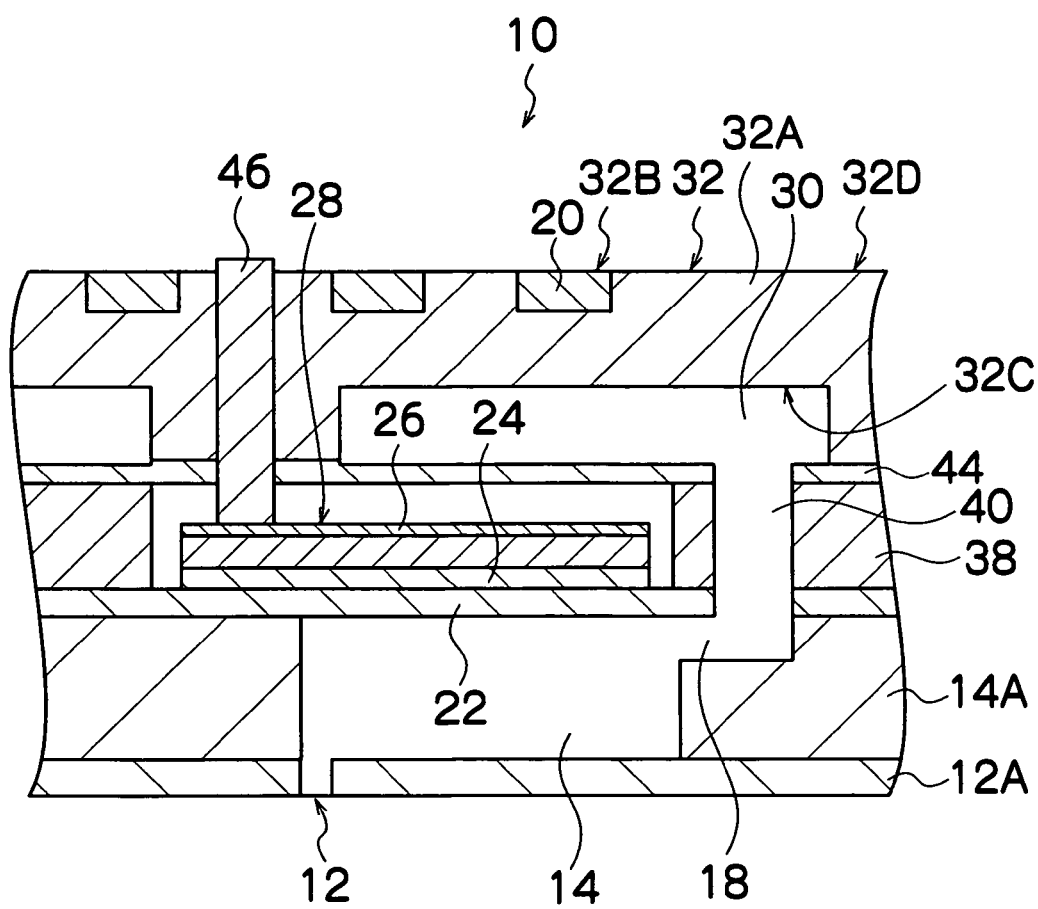
FIG. 3 is a cross-sectional diagram showing a further embodiment of the structure of the head shown in FIG. 2.

FIG. 2 is a cross-sectional diagram showing the three-dimensional composition of the head 10, and FIG. 3 is a cross-sectional diagram showing a further embodiment of the structure of the head 10 shown in FIG. 2.

As shown in FIG. 2, the actuator (ejection force generating element) 28 provided with a common electrode 24 and an individual electrode 26 is bonded to a pressure plate 22, which forms the ceiling of the pressure chambers 14. When a drive voltage is applied to the individual electrode 26, the actuator 28 is deformed, thereby causing ink to be ejected from the nozzle 12. If the pressure plate 22 is constituted by a material having conductive properties such as a metal material (e.g., stainless steel), then it is possible to form the pressure plate 22 and the common electrode 24 as a common element.

When ink is ejected from the nozzle 12, new ink is supplied to the pressure chamber 14 from the common flow channel (common liquid chamber) 30, through the supply port 18.

For the actuator 28 shown in FIG. 2, it is suitable to adopt a piezoelectric element using ceramic material such as PZT ($Pb(Zr,Ti)O_3$, lead zirconate titanate), or a piezoelectric element using a fluororesin material, such as a PVDF (polyvinylidene fluoride) and PVDF-TrFE (copolymer of polyvinylidene fluoride and trifluoroethylene).

The wiring substrate 32 formed with the wiring pattern 20, which transmits a drive signal to be applied to the actuator 28, is arranged on the side of the actuator 28 reverse to the side facing to the pressure chamber 14. An extension electrode 34 extends from the individual electrode 26 and is electrically connected to the wiring pattern 20 formed on the wiring substrate 32 (or to an extension electrode (not shown) extending from the wiring pattern 20) by means of a conductive bonding member 36. It is suitable to use a solder, conductive adhesive (anisotropic adhesive), or the like, as the conductive bonding member 36.

The extension electrode 34 extending from the individual electrode 26 may be formed on the surface of the actuator 28 on which the individual electrode 26 is formed, or the extension electrode 34 may be formed on the region of the pressure plate 22 where no actuator is arranged.

A prescribed clearance is provided between the actuator 28 and the wiring substrate 32, in such a manner that the bending deformation of the actuator 28 is not restricted when the actuator 28 is operated. It is also possible to fill a member having a lower rigidity than the pressure plate 22 or the wiring substrate 32, in between the actuator 28 and the wiring substrate 32.

In the head 10 shown in FIG. 2, a supply side flow channel 40 is formed to pass through the pressure plate 22, a supporting member 38 supporting the wiring substrate 32 from the side adjacent to the pressure plate 22, and the wiring substrate 32. The common flow channel 30 provided on the opposite side of the wiring substrate 32 from the actuator 28 is connected to the pressure chamber 14 through the supply side flow channel 40 and a supply port 18.

A shielding member 42, which shuts off the common flow channel 30 from external air, is provided above the common flow channel 30 on the opposite side from the wiring substrate 32.

In other words, the head 10 has a laminated structure in which the plurality of members (cavity plates) are layered together, and more specifically, it has the laminated structure where a pressure chamber plate 14A formed with the pressure chambers 14 is layered onto a nozzle plate 12A formed with the nozzles 12, and furthermore, the pressure plate 22, the supporting member 38, the wiring substrate 32, a common flow channel plate 30A formed with the common flow channel 30, and the shielding member 42, are layered in sequence on the pressure chamber plate 14A.

In the mode where the common flow channel 30 is provided on the opposite side of the pressure chambers 14 from the pressure plate 22 as shown in FIG. 2, even if the ejection elements 16 (see FIGS. 1A and 1B) are arranged at high density, it is still possible to ensure that the common flow channel 30 has a prescribed size, rather than the size of the common flow channel 30 being reduced, and hence increase in the flow channel resistance due to increase in the flow channel length of the nozzles 12 (ejection side flow channels) is prevented, and a desirable ejection operation maintaining a high ejection frequency can be achieved.

A mode shown in FIG. 3 is more desirable in that, compared to the mode shown in FIG. 2, the length of the flow channel of the supply side flow channel 40 is reduced and hence the flow channel resistance of the supply side flow channel 40 is reduced. In the mode shown in FIG. 3, a structure is adopted in which the common flow channel 30 is arranged on the opposite side of the actuators 28 from the pressure plate 22, and the wiring substrate 32 is arranged on the opposite side of the common flow channel 30 from the actuators 28. The supply side flow channel 40 is arranged so as to pass through a bottom wall 44 of the common flow channel 30 and the supporting member 38. Thus, the flow channel length of the supply side flow channel 40 is shortened in comparison with the mode shown in FIG. 2. Therefore, the flow channel resistance of the supply side flow channel 40 is reduced in comparison with the mode shown in FIG. 2.

Moreover, a composition is adopted in which the individual electrode 26 and the wiring pattern 20 formed on the wiring substrate 32 are electrically connected by means of a vertical wiring member 46, which is formed so as to rise up from an extension electrode extending from the individual electrode 26 of the actuator 28 and passes through at least a portion of the common flow channel 30.

FIG. 3 shows the mode in which the vertical wiring member 46 is arranged so as to pass through the member formed inside the common flow channel 30 (an insulating layer 32A of the wiring substrate 32), but it is also possible to provide a vertical wiring member 46 having an insulation treatment (ink resistance treatment) formed on the surface thereof, in the regions where it makes contact with the ink accommodated in the common flow channel 30.

In the head 10 shown in FIG. 3, recess sections (groove sections) forming the common liquid chamber 30 are formed on the wiring substrate 32, and therefore, the common flow channel plate 30A can be omitted from the members constituting the laminated structure shown in FIG. 2.

The wiring substrate 32 shown in FIGS. 2 and 3 has an insulating layer 32A, which uses a resin material, such as glass epoxy, polyimide, or the like, and a wiring pattern 20 which uses a conductive material and is formed in the recess sections (groove sections) 32B provided in the insulating layer 32A.

FIG. 2 and FIG. 3 show the wiring substrate 32 in which the wiring pattern 20 is formed on one of the horizontal surfaces (wiring pattern forming surfaces) 32C and 32D, but it is also possible to form the wiring pattern 20 on both of the two horizontal surfaces 32C and 32D of the wiring substrate 32. Furthermore, it is also possible to adopt a mode using a multiple-layer structure in which a plurality of wiring substrates 32 having the structure described above are layered together.

Method of Manufacturing Wiring Substrate

First Embodiment

Next, the method of manufacturing the wiring substrate 32 according to a first embodiment of the present invention is described. FIGS. 4A to 4F are step diagrams which describe the respective steps of forming a wiring pattern on the wiring substrate 32.

Figure 4A:
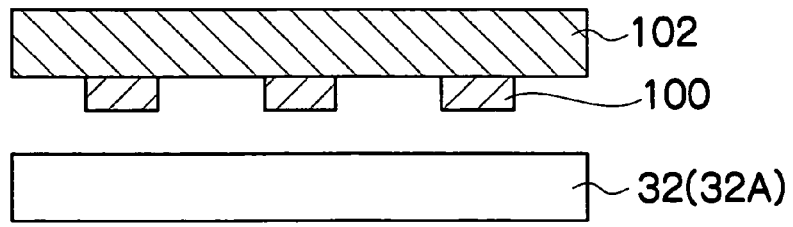
FIGS. 4A to 4F are diagrams showing steps for manufacturing the head.
Figure 4B:
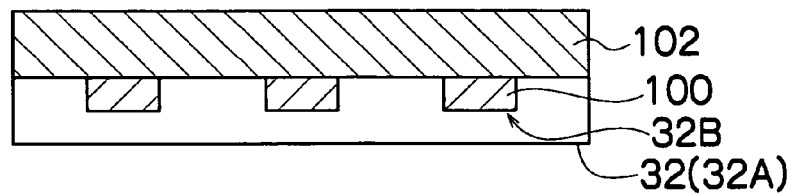
Figure 4C:
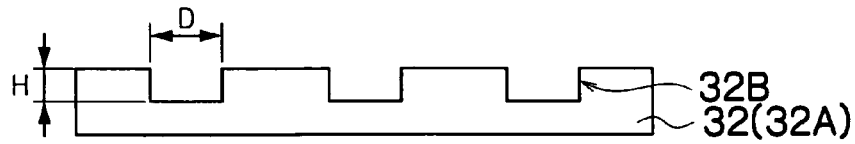

As shown in FIG. 4A, firstly, using a stamper 102 formed with projecting sections 100 corresponding to the wiring pattern 20 to be formed on the wiring substrate 32 (insulating layer 32A) (in other words, the projecting sections 100 having the same pattern shape as the wiring pattern 20), recess sections 32B having the same pattern shape as the wiring pattern 20 are formed on the wiring substrate 32 (insulating layer 32A), as shown in FIG. 4B (recess section forming step). FIG. 4C shows the wiring substrate 32 on which the recess sections 32B have been formed.

A desirable mode is one in which the recess sections 32B shown in FIG. 4C have a width D of 30 μm or less. Furthermore, desirably, the aspect ratio, which is the ratio between the depth H with respect to the width D, is 0.5 or above.

Figure 4D:
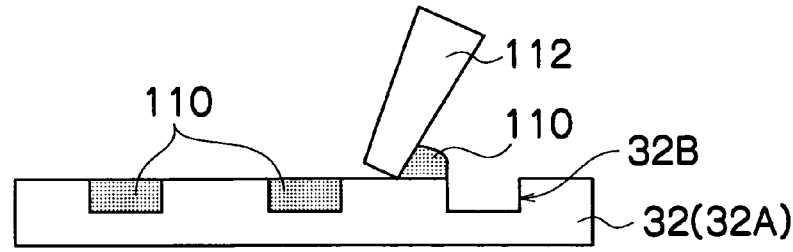

Subsequently, as in FIG. 4D, conductive paste 110 including thinner (for example, "DD paste TH9910" manufactured by Tatsuta System Electronics Co., Ltd.) is filled into the recess sections 32B formed on the wiring substrate 32. FIG. 4D shows a mode in which the conductive paste 110 is filled into the recess sections 32B by placing a squeegee 112 in contact with the wiring pattern forming surface 32D in which the recess sections 32B are formed, and moving the squeegee 112.

In the wiring substrate 32 shown in the present embodiment, since the recess sections 32B are formed previously in the sections where the conductive paste 110 is to be deposited, then a mask for depositing the conductive paste 110 on the wiring substrate 32 is not required, and if the conductive paste 110 has been deposited onto sections other than the recess sections 32B, then this conductive paste 110 is wiped and removed by using a wiping member, such as a blade.

Figure 4E:
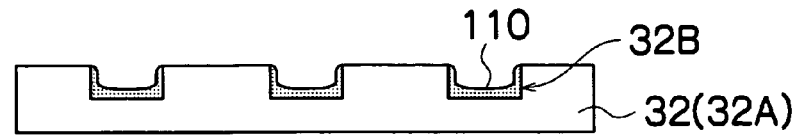

Thereupon, the conductive paste 110 filled in the recess sections 32B is dried and cured (curing step). When the conductive paste 110 dries and cures, then as shown in FIG. 4E, the conductive paste 110 contracts inside the recess sections 32B, and assumes a state in which the contracted conductive paste 110 remains on at least a portion of the interior of the recess sections 32B, namely, the bottom face and the inner circumferential faces of the recess sections 32B. More specifically, when the conductive paste 110 filled in the recess sections 32B has dried and cured, then the contracted conductive paste (a conductive paste film) 110 is formed on the bottom face and the inner circumferential faces of the recess sections 32B. Here, to give one example of the drying and curing conditions in the curing step, the treatment temperature is 30° C. to 40° C. and the treatment time is approximately one hour.

Figure 4F:
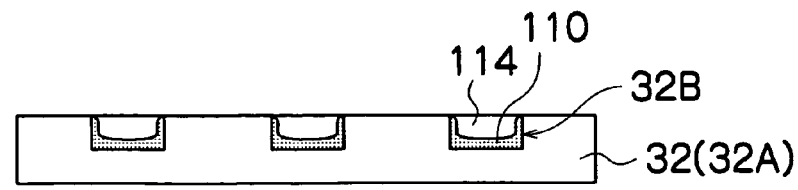

After the conductive paste film 110 is formed on the bottom face and the inner circumferential faces of the recess sections 32B by means of the curing step, a plating process is carried out as shown in FIG. 4F, using the conductive paste film 110 as a catalyst (foundation) or as a current feed layer, and wiring conductors 114 are thereby formed on the conductive paste film 110 (plating step).

The wiring conductors 114 thus formed inside the recess sections 32B by means of the above-described manufacturing steps, function as the wiring pattern transmitting drive signals to the actuators 28. A conductive material, such as gold or copper, is used as the wiring conductors 114. By using the wiring conductors 114 formed inside the recess sections 32B by means of the plating process, as the wiring pattern 20, it is possible to reduce the wiring impedance in comparison with a case where the wiring pattern 20 is formed by only the conductive paste 110.

Next, the plating process in the plating step is described. It is possible use an electroless plating method or an electrolytic plating method in the plating step according to the present embodiment. FIGS. 5A to 5D show a mode where the wiring conductors 114 are formed by adopting an electroless plating method.

Figure 5A:
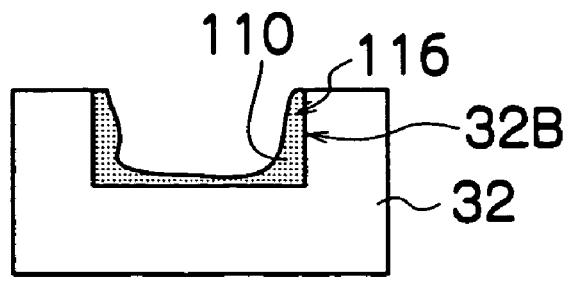
FIGS. 5A to 5D are diagrams showing a plating step using an electroless plating method, in the method of manufacture shown in FIGS. 4A to 4F.
Figure 5B:
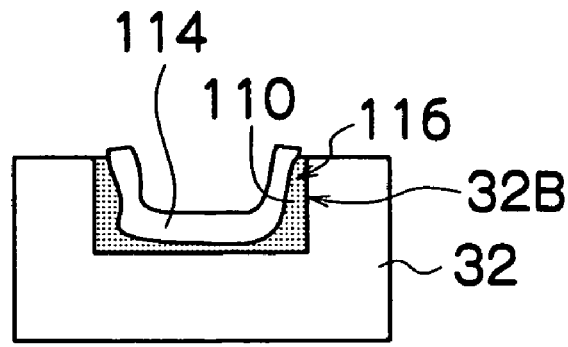
Figure 5C:
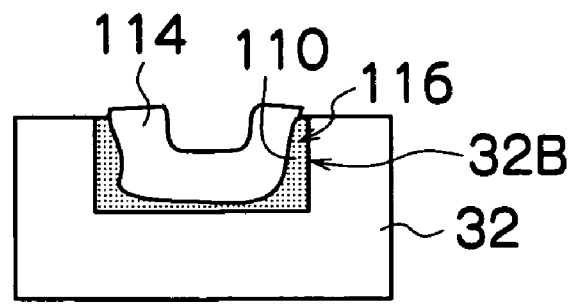
Figure 5D:
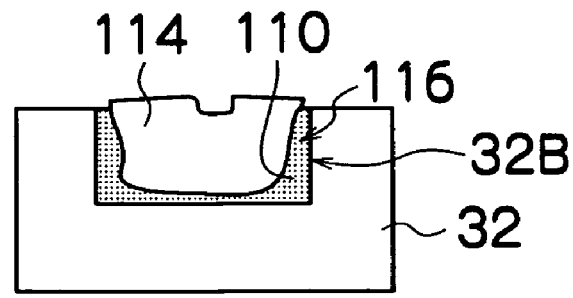

When the wiring substrate 32 formed with the conductive paste film 110 on the bottom surface and the inner circumferential surface of the recess sections 32B shown in FIG. 5A is immersed into an electroless plating solution, then since filler 116 such as silver or copper contained in the conductive paste film 110 has catalytic properties, a plating reaction starts at the surface of the filler 116, with the conductive paste 110 acting as a catalyst, and the electroless plating metal forming the wiring conductors 114 starts to precipitate, as shown in FIG. 5B. Moreover, as the plating reaction progresses, then as shown in FIG. 5C, the amount of electroless plating metal (wiring conductor 114) precipitated in the recess sections 32B increases, and as shown in FIG. 5D, the conductive bodies 114 are formed so as to cover the recess sections 32B.

Figure 6A:
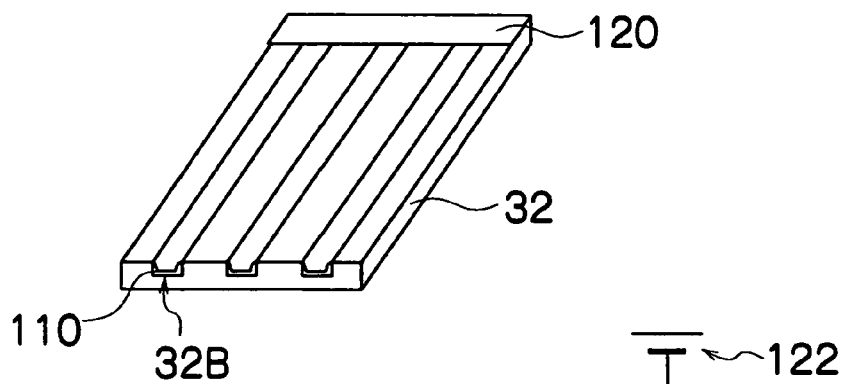
FIGS. 6A to 6D are diagrams showing a plating step using an electrolytic plating method, in the method of manufacture shown in FIGS. 4A to 4F.

On the other hand, FIGS. 6A to 6D show a mode where the wiring conductors 114 are formed by adopting an electrolytic plating method. As shown in FIG. 6A, in the mode where the electrolytic plating method is used, since the conductive paste 110 which has contracted by drying and curing in the recess sections 32B is used as a current feed layer (seed layer), then a current feed section 120 is provided in such a manner that all of the conductive paste 110 formed on the wiring substrate 32 is connected electrically to the current feed section 120 (in a current feed section forming step).

Figure 6B:
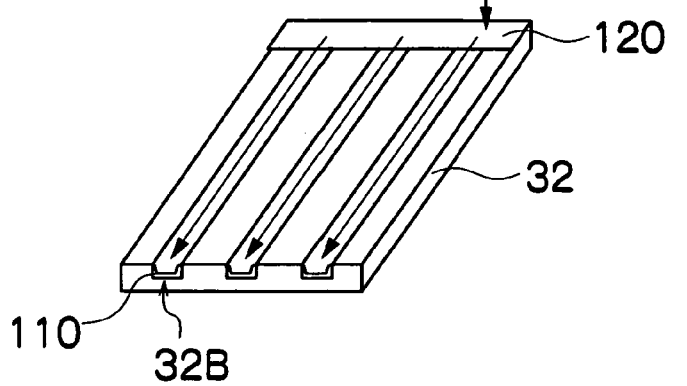
Figure 6C:
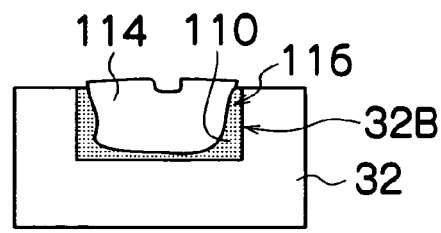
Figure 6D:
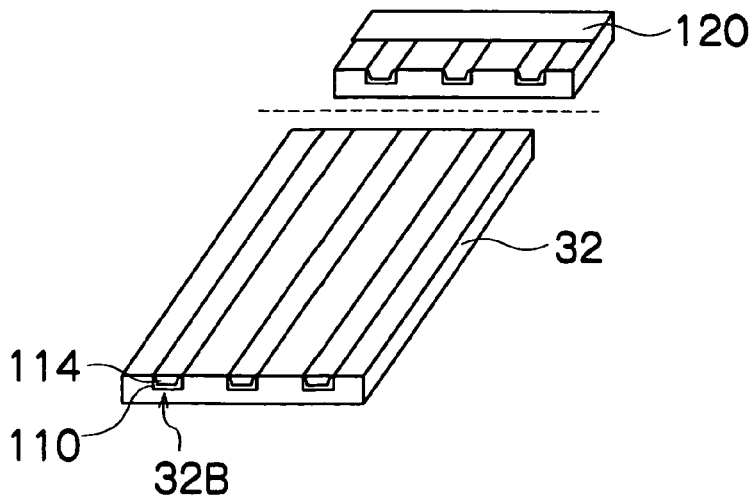

When the wiring substrate 32 provided with the current feed section 120 is immersed into an electrolytic plating solution and a current is supplied to the current feed section 120 from a power supply 122, then the current passes through the conductive paste 110 inside the recess sections 32B as indicated by the arrow lines in FIG. 6B, and an electrolytic plating metal forming the wiring conductors 114 is precipitated into the recess sections 32B as shown in FIG. 6C. When a prescribed amount of the electrolytic plating metal has precipitated inside the recess sections 32B thereby forming the wiring conductors 114, then the current feed section 120 is removed from the wiring substrate 32 as shown in FIG. 6D (in a current feed section removing step).

If the electroless plating method as described with reference to FIGS. 5A to 5D is used to form the wiring conductors 114, then after drying and curing of the conductive paste 110, it is possible to form the wiring conductors 114 inside the recess sections 32B simply by immersing the wiring substrate 32 into an electroless plating solution. Therefore, the current feed section 120 and the power supply 122, which are required in the electrolytic plating method, are not necessary.

On the other hand, when the electrolytic plating method described with reference to FIGS. 6A to 6D is used to form the wiring conductors 114, then the precipitated metal contains few impurities and assumes a composition close to that of pure metal, and the impedance can be reduced in comparison to the metal precipitated by using the electroless plating method. Moreover, the electrolytic plating solution used in the electrolytic plating method has a simpler composition than the electroless plating solution used in the electroless plating method, and the solution is easier to manage.

In other words, in order to lower the wiring impedance, a desirable mode is one in which the wiring conductors 114 are formed by using the electrolytic plating method, whereas in order to simplify the step of forming the wiring conductors 114, a desirable mode is one using the electroless plating method. It is possible to select whether to use the electroless plating method, or to use the electrolytic plating method, for the plating step of forming the wiring conductors 114, appropriately, in accordance with the object.

In the wiring substrate 32 having the composition described above, the recess sections 32B having the same pattern shape as the wiring pattern 20 are formed, the conductive paste 110 containing thinner (diluting solvent) is filled into the recess sections 32B, and the conductive paste 110 is dried and cured, whereupon the plating process is carried out in the recess sections 32B, and the wiring conductors 114 are formed inside the recess sections 32B. Therefore, a mask is not required during filling of the conductive paste 110. Moreover, since the conductive paste 110 contracts when the conductive paste 110 dries and cures, thereby creating a space for forming the wiring conductors 114 in the recess sections 32B, and since the metal forming the wiring conductors 114 is precipitated by means of the plating process in the space forming these wiring conductors 114, then low impedance of the wiring pattern 20 is achieved in comparison with a case where the wiring pattern 20 is formed by means of only the conductive paste 110.

Since the conductive paste (conductive paste film) 110 in which resin and the metallic filler are mixed together is present between the wiring substrate 32 made of resin material and the wiring conductors 114 made of metal material, then the conductive paste 110 functions as an intermediate composite layer, thereby improving the bonding force between the resin material and the metal material.

Second Embodiment

Figure 7A:
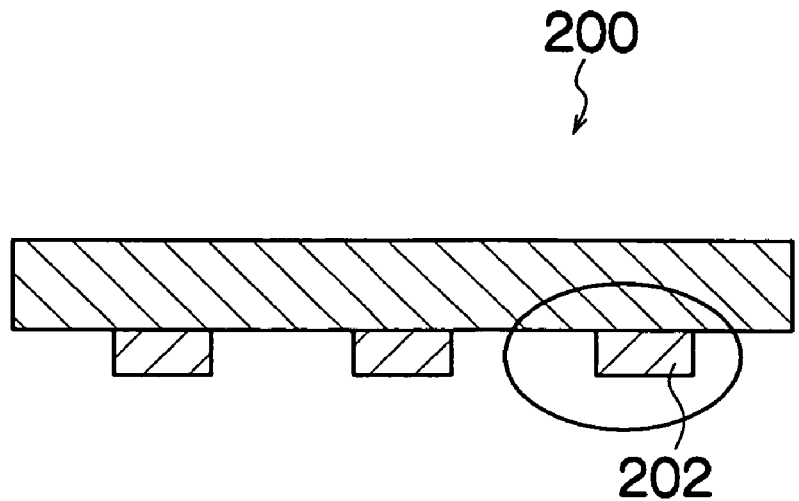
FIGS. 7A and 7B are diagrams showing a second embodiment of the present invention.

Next, a method of manufacturing the wiring substrate 32 according to a second embodiment of the present invention is described. FIG. 7A shows a stamper 200 used in the second embodiment, and FIG. 7B is an enlarged view of a projecting section 202 provided on the stamper 200 (the section enclosed by the circle in FIG. 7A).

Figure 7B:
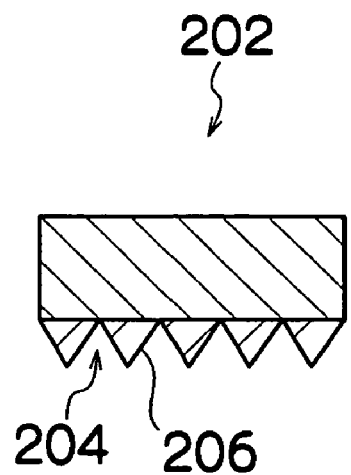

As shown in FIG. 7B, the projecting section 202 provided on the stamper 200 has an undulating shape including very fine recess shapes 204 and projecting shapes 206 in the portions corresponding to the bottom faces of the recess sections 32B (namely, an undulating shape having a smaller pitch than the width of the wiring pattern 20 and the pitch between the wires of the wiring pattern), and when this stamper 200 is used to form the recess sections 32B in the wiring substrate 32, then a very fine undulating shape corresponding to the undulating shape formed on the projecting sections 202 of the stamper 200 is formed onto the bottom face portions of the recess sections 32B.

When the very fine undulating shape is formed in the recess sections 32B of the wiring substrate 32, it is possible to improve the bonding characteristics between the wiring substrate 32 and the wiring pattern 20 constituted by the conductive paste 110 and the wiring conductors 114, and therefore it is possible to improve the bonding reliability between the wiring substrate 32 and the wiring pattern 20.

FIGS. 7A and 7B depict the mode in which the very fine undulating shape is formed in the recess sections 32B of the wiring substrate 32 by using the stamper 200 formed with the undulating shape having the projecting sections 202. The method to form the very fine undulating shape in the recess sections 32B is not limited to this method. For example, the undulating shape may be formed in the recess sections 32B by machining or chemical processing after forming the recess sections 32B on the wiring substrate in use of the stamper 102 as shown in FIGS. 4A to 4F.

Third Embodiment

Next, a method of manufacturing the wiring substrate 32 (head 10) according to a third embodiment of the present invention is described. In the present embodiment, when forming the wiring substrate 32 by using a mold, through holes 32E (shown in FIG. 8B) to form the recess sections 32B and the supply side flow channels 40 are integrally molded.

FIG. 8A shows the mold 300 used to cast the wiring substrate 32 shown in FIG. 2 from a resin material. Space sections 302 for forming the insulating layer 32A in the wiring substrate 32, projecting sections 304 corresponding to the recess sections 32B, and column sections 306 for forming the supply side flow channels 40, and the like, are formed in the mold 300, and a resin material is injected through an injection hole 310, thereby forming the wiring substrate 32 having the recess sections 32B, the through holes 32E to become the supply side flow channels 40, and the like as shown in FIG. 8B.

Figure 9A:
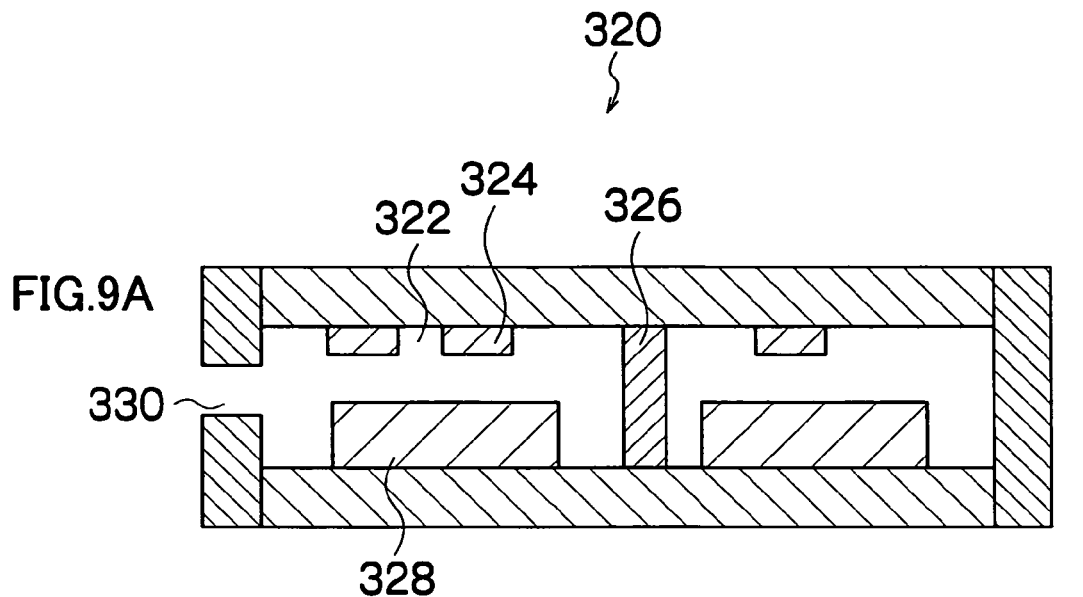
FIGS. 9A and 9B are diagrams showing a further mode of the mode shown in FIGS. 8A and 8B.

FIG. 9A shows a mold 320 used to cast the wiring substrate 32 shown in FIG. 3, from a resin material.

Figure 9B:
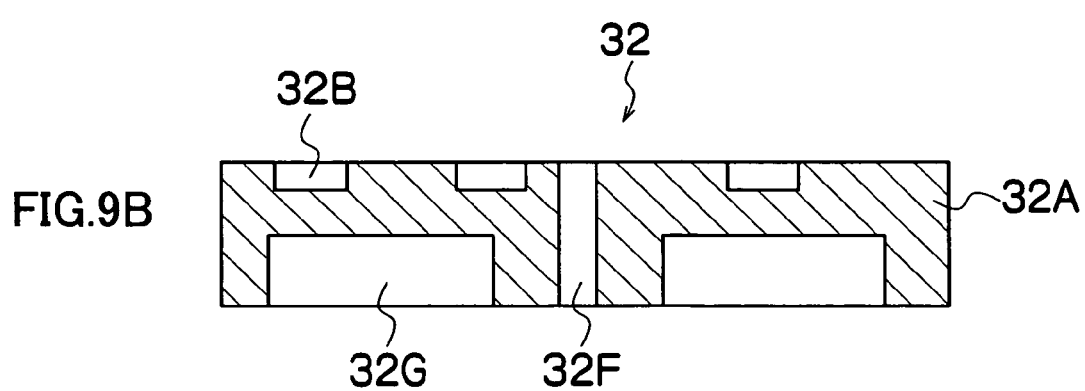

The mold 320 is formed with: space sections 322 for forming the insulating layer 32A of the wiring substrate 32; projecting sections 324 corresponding to the recess sections 32B; column sections 326 corresponding to through holes 32F (shown in FIG. 9B) in which the vertical wiring members 46 are to be formed; projecting sections 328 corresponding to space sections 32G (shown in FIG. 9B) which form regions where the actuators 28 are to be disposed; and the like. By injecting resin material through the injection hole 330, the wiring substrate 32 is formed, which comprises the recess sections 32B, the through holes 32F in which the vertical wiring members 46 are to be formed, and the space sections 32G corresponding to the regions where the actuators 28 are to be disposed, as shown in FIG. 9B.

The thus formed wiring substrate 32 is processed in the steps described with reference to FIGS. 4A to 4F, 5A to 5D, or 6A to 6D, so as to form the wiring pattern 20, and is bonded to a flow channel structure in which the nozzles 12, the pressure chambers 14 and the common flow channel 30, and the like, are formed.

In this way, if the wiring substrate 32 is formed by means of integral casting of a resin material by using the mold 300 or 320, then it is possible to form the recess sections 32B and the remainder of the structure, in a single processing step, and therefore the manufacturing process for the wiring substrate 32 can be simplified, and the processing accuracy of the wiring substrate 32 can be improved.

General Composition of Inkjet Recording Apparatus

An inkjet recording apparatus forming an image forming apparatus comprising the head 10 according to the present embodiment is described below.

Figure 10:
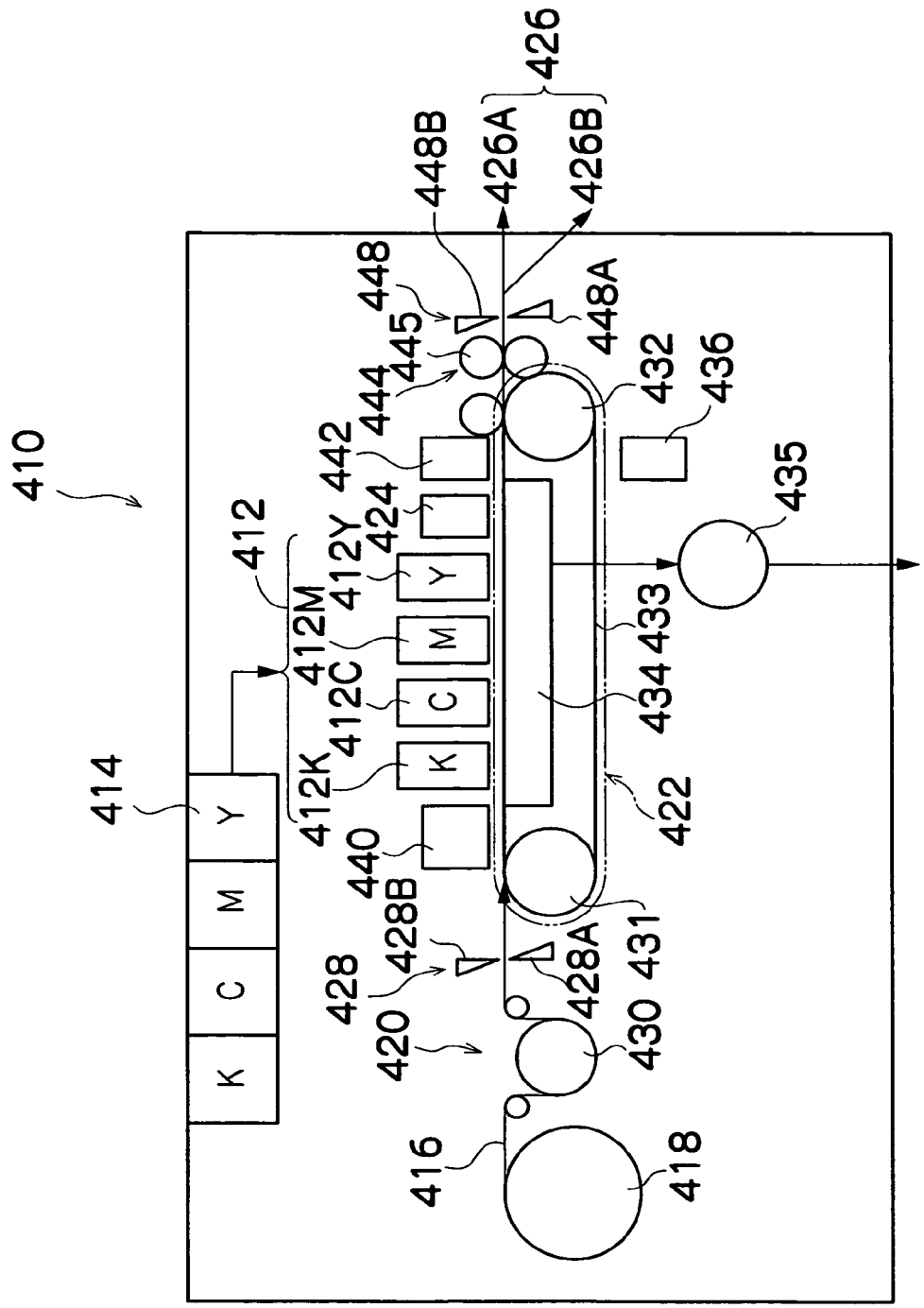
FIG. 10 is a general schematic drawing of an inkjet recording apparatus according to an embodiment of the present invention.

FIG. 10 is a diagram of the general composition of an inkjet recording apparatus 410 according to an embodiment of the present invention. As shown in FIG. 10, the inkjet recording apparatus 410 comprises: a print unit 412 having a plurality of ejection heads 412K, 412C, 412M, and 412Y provided for ink colors of black (K), cyan (C), magenta (M), and yellow (Y), respectively; an ink storing and loading unit 414 for storing inks of K, C, M and Y to be supplied to the heads 412K, 412C, 412M, and 412Y; a paper supply unit 418 for supplying recording medium 416; a decurling unit 420 for removing curl from the recording medium 416; a belt suction conveyance unit 422, disposed facing the nozzle face (ink ejection face) of the print unit 412, for conveying the recording medium 416 while keeping the recording medium 416 flat; and a paper output unit 426 for outputting printed recording paper (printed matter) to the exterior.

The ejection heads (heads 10) according to the embodiment of the present invention described above is used respectively for the inkjet heads 412K, 412C, 412M and 412Y provided in the print unit 412.

The ink storing and loading unit 414 has ink supply tanks for storing the inks of K, C, M and Y to be supplied to the inkjet heads 412K, 412C, 412M, and 412Y, and the tanks are connected to the inkjet heads 412K, 412C, 412M, and 412Y respectively by means of prescribed channels. The ink storing and loading unit 414 has a warning device (for example, a display device or an alarm sound generator) for warning when the remaining amount of any ink is low, and has a mechanism for preventing loading errors among the colors.

In FIG. 10, a magazine for rolled paper (continuous paper) is shown as an embodiment of the paper supply unit 418; however, more magazines with paper differences such as paper width and quality may be jointly provided. Moreover, papers may be supplied with cassettes that contain cut papers loaded in layers and that are used jointly or in lieu of the magazine for rolled paper.

In the case of a configuration in which a plurality of types of recording paper can be used, it is preferable that an information recording medium such as a bar code and a wireless tag containing information about the type of paper is attached to the magazine, and by reading the information contained in the information recording medium with a predetermined reading device, the type of recording medium to be used (type of medium) is automatically determined, and ink-droplet ejection is controlled so that the ink-droplets are ejected in an appropriate manner in accordance with the type of medium.

The recording medium 416 delivered from the paper supply unit 418 retains curl due to having been loaded in the magazine. In order to remove the curl, heat is applied to the recording medium 416 in the decurling unit 420 by a heating drum 430 in the direction opposite from the curl direction in the magazine. The heating temperature at this time is preferably controlled so that the recording medium 416 has a curl in which the surface on which the print is to be made is slightly round outward.

In the case of the configuration in which roll paper is used, a cutter (first cutter) 428 is provided as shown in FIG. 10, and the continuous paper is cut into a desired size by the cutter 428. The cutter 428 has a stationary blade 428A, whose length is not less than the width of the conveyor pathway of the recording medium 416, and a round blade 428B, which moves along the stationary blade 428A. The stationary blade 428A is disposed on the reverse side of the printed surface of the recording medium 416, and the round blade 428B is disposed on the printed surface side across the conveyor pathway. When cut papers are used, the cutter 428 is not required.

The decurled and cut recording medium 416 is delivered to the suction belt conveyance unit 422. The suction belt conveyance unit 422 has a configuration in which an endless belt 433 is set around rollers 431 and 432 so that the portion of the endless belt 433 facing at least the nozzle face of the print unit 412 forms a horizontal plane (flat plane).

The belt 433 has a width that is greater than the width of the recording medium 416, and a plurality of suction apertures (not shown) are formed on the belt surface. A suction chamber 434 is disposed in a position facing the sensor surface of a print determination unit 424 and the nozzle surface of the print unit 412 on the interior side of the belt 433, which is set around the rollers 431 and 432, as shown in FIG. 10. The suction chamber 434 provides suction with a fan 435 to generate a negative pressure, and the recording medium 416 is held on the belt 433 by suction.

The belt 433 is driven in the clockwise direction in FIG. 10 by the motive force of a motor (not shown) being transmitted to at least one of the rollers 431 and 432, about which the belt 433 is set, and the recording medium 416 held on the belt 433 is conveyed from left to right in FIG. 10.

Since ink adheres to the belt 433 when a marginless print job or the like is performed, a belt-cleaning unit 436 is disposed in a predetermined position (a suitable position outside the printing area) on the exterior side of the belt 433. Although the details of the configuration of the belt-cleaning unit 436 are not shown, embodiments thereof include a configuration in which the belt 433 is nipped with cleaning rollers such as a brush roller and a water absorbent roller, an air blow configuration in which clean air is blown onto the belt 433, or a combination of these. In the case of the configuration in which the belt 433 is nipped with the cleaning rollers, it is preferable to make the line velocity of the cleaning rollers different than that of the belt 433 to improve the cleaning effect.

A roller nip conveyance mechanism may be employed, instead of the suction belt conveyance unit 422. However, there is a drawback in the roller nip conveyance mechanism that the print tends to be smeared when the printing area is conveyed by the roller nip action because the nip roller makes contact with the printed surface of the paper immediately after printing. Therefore, the suction belt conveyance in which nothing comes into contact with the image surface in the printing area is preferable.

A heating fan 440 is disposed on the upstream side of the print unit 412 in the conveyance pathway formed by the suction belt conveyance unit 422. The heating fan 440 blows heated air onto the recording medium 416 to heat the recording medium 416 immediately before printing so that the ink deposited on the recording medium 416 dries more easily.

The inkjet heads 412K, 412C, 412M, and 412Y provided in the print unit 412 are arranged in color order (black (K), cyan (C), magenta (M), yellow (Y)) from the upstream side in the conveyance direction of the recording medium 416, and these respective print heads 412K, 412M, 412C and 412Y are provided in a fixed manner, extending in a direction substantially perpendicular to the conveyance direction of the recording medium 416.

Although the configuration with the KCMY four standard colors is described in the present embodiment, combinations of the ink colors and the number of colors are not limited to those. Light inks, dark inks or special color inks can be added as required. For example, a configuration is possible in which inkjet heads for ejecting light-colored inks such as light cyan and light magenta are added. Furthermore, there are no particular restrictions of the sequence in which the heads of respective colors are arranged.

A post-drying unit 442 is disposed following the print unit 412. The post-drying unit 442 is a device to dry the printed image surface, and includes a heating fan, for example. It is preferable to avoid contact with the printed surface until the printed ink dries, and a device that blows heated air onto the printed surface is preferable.

In cases in which printing is performed with dye-based ink on porous paper, blocking the pores of the paper by the application of pressure prevents the ink from coming contact with ozone and other substance that cause dye molecules to break down, and has the effect of increasing the durability of the print.

A heating/pressurizing unit 444 is disposed following the post-drying unit 442. The heating/pressurizing unit 444 is a device to control the glossiness of the image surface, and the image surface is pressed with a pressure roller 445 having a predetermined uneven surface shape while the image surface is heated, and the uneven shape is transferred to the image surface.

The printed matter generated in this manner is outputted from the paper output unit 426. The target print (i.e., the result of printing the target image) and the test print are preferably outputted separately. In the inkjet recording apparatus 410, a sorting device (not shown) is provided for switching the outputting pathways in order to sort the printed matter with the target print and the printed matter with the test print, and to send them to paper output units 426A and 426B, respectively. When the target print and the test print are simultaneously formed in parallel on the same large sheet of paper, the test print portion is cut and separated by a cutter (second cutter) 448. The cutter 448 is disposed directly in front of the paper output unit 426, and is used for cutting the test print portion from the target print portion when a test print has been performed in the blank portion of the target print. The structure of the cutter 448 is the same as the first cutter 428 described above, and has a stationary blade 448A and a round blade 448B.

Although not shown in FIG. 10, the paper output unit 426A for the target prints is provided with a sorter for collecting prints according to print orders.

Description of Ink Supply System

Next, the ink supply system of the inkjet recording apparatus 410 is described.

Figure 11:
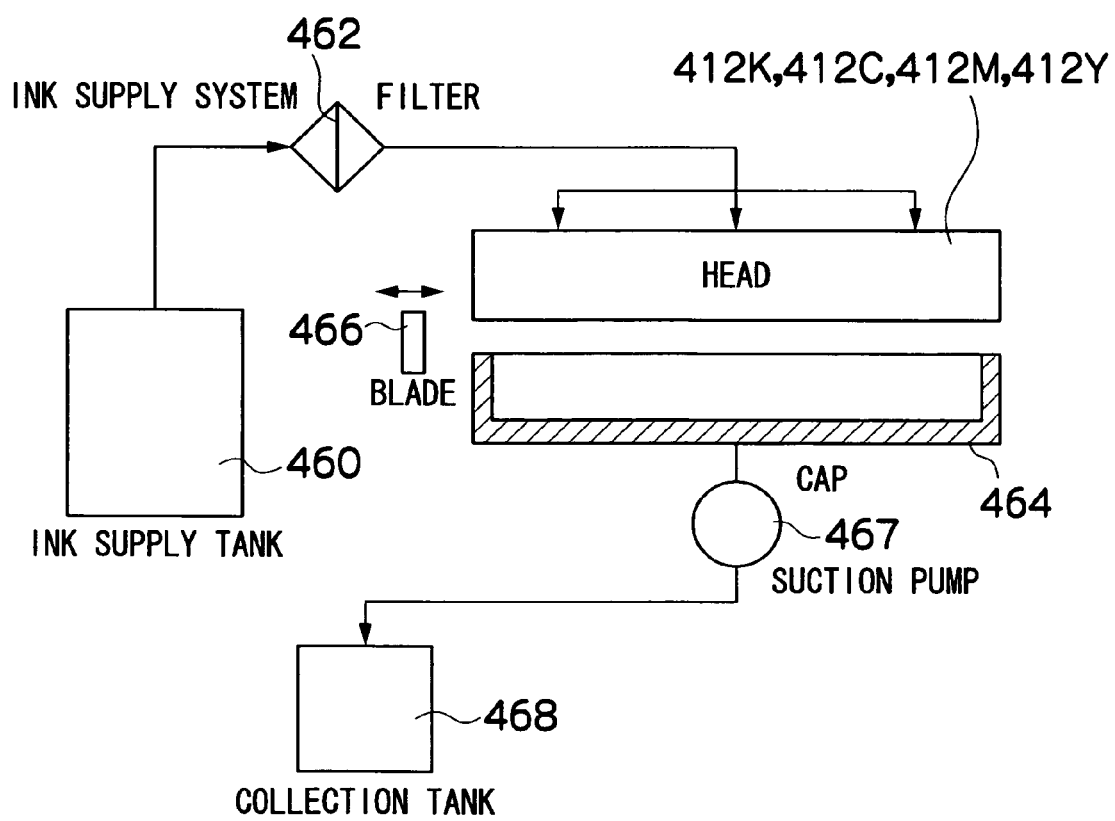
FIG. 11 is an approximate diagram showing the composition of an ink supply system of the inkjet recording apparatus shown in FIG. 10.

FIG. 11 shows the composition of an ink supply system provided in the inkjet recording apparatus 410. The ink supply system shown in FIG. 11 corresponds to the storing and loading unit 414 described in FIG. 10.

An ink supply tank 460 forming a base tank for supplying ink is disposed in the ink supply system shown in FIG. 11. The aspects of the ink supply tank 460 include a refillable type and a cartridge type: when the remaining amount of ink is low, the ink tank 460 of the refillable type is filled with ink through a filling port (not shown) and the ink tank 460 of the cartridge type is replaced with a new one. In order to change the ink type in accordance with the intended application, the cartridge type is suitable, and it is preferable to represent the ink type information with a bar code or the like on the cartridge, and to perform ejection control in accordance with the ink type.

Furthermore, the ink in the ink supply tank 460 is supplied to the heads 412K, 412C, 412M, 412Y, after being passed through a filter 462 and prescribed tubing channels (not shown), in order to remove foreign material and air bubbles. The filter mesh size in the filter 462 is preferably equivalent to or less than the diameter of the nozzle and is commonly about 20 μm.

Although not shown in FIG. 11, it is preferable to provide a sub-tank integrally with the heads 412K, 412C, 412M and 412Y or in the vicinity of the heads 412K, 412C, 412M and 412Y. The sub tanks have a damper function for preventing variation in the internal pressure of the heads and a function for improving refilling of the heads 412K, 412C, 412M and 412Y.

The inkjet recording apparatus 410 is also provided with a cap 464 as a device to prevent the nozzles 12 (shown in FIGS. 1A to 1C) from drying out or to prevent an increase in the ink viscosity in the vicinity of the nozzles, and a cleaning blade 466 as a device to clean the nozzle face. A maintenance unit including the cap 464 and the cleaning blade 466 can be relatively moved with respect to the heads 412K, 412C, 421M, and 412Y by a movement mechanism (not shown), and is moved from a predetermined holding position to a maintenance position below the heads 412K, 412C, 412M, and 412Y as required.

The cap 464 is displaced up and down relatively with respect to the heads 412K, 412C, 412M, and 412Y by an elevator mechanism (not shown). When the power of the inkjet recording apparatus 410 is turned OFF or when in a print standby state, the cap 464 is raised to a predetermined elevated position so as to come into close contact with the heads 412K, 412C, 412M, and 412Y, and the nozzle face is thereby covered with the cap 464.

During printing or standby, if the use frequency of a particular nozzle 12 is low, and if a state of not ejecting ink continues for a prescribed time period or more, then the solvent of the ink in the vicinity of the nozzle evaporates and the viscosity of the ink increases. In a situation of this kind, it will become impossible to eject ink from the nozzle 12, even if the actuator 28 (shown in FIG. 2) is operated.

Therefore, before a situation of this kind develops (more specifically, while the ink is within a range of viscosity which allows it to be ejected by operation of the actuator 28), the actuator 28 is operated, and a preliminary ejection ("purge", "blank ejection", "liquid ejection" or "dummy ejection") is carried out toward the cap, in order to expel the degraded ink (namely, the ink in the vicinity of the nozzle which has increased viscosity).

Furthermore, if bubbles enter into the ink inside the heads 412K, 412C, 412M, and 412Y then even if the actuator 28 is operated, it will not be possible to eject ink from the nozzle. In a case of this kind, the cap 464 is placed on the heads 412K, 412C, 412M, and 412Y the ink (ink containing air bubbles) inside the heads 412K, 412C, 412M, and 412Y is removed by suction, by means of a suction pump 467, and the ink removed by suction is then supplied to a collection tank 468.

This suction operation is also carried out in order to remove degraded ink having increased viscosity (hardened ink), when ink is loaded into the head for the first time, and when the head starts to be used after having been out of use for a long period of time. Since the suction operation is carried out with respect to all of the ink inside the pressure chamber 14 (shown in FIG. 2), the ink consumption is considerably large. Therefore, desirably, preliminary ejection is carried out when the increase in the viscosity of the ink is still minor.

The cleaning blade 466 is composed of rubber or another elastic member, and can slide on the ink ejection surface (surface of the nozzle plate) of the heads 412K, 412C, 412M, and 412Y by means of a blade movement mechanism (wiper) (not shown). When ink droplets or foreign matter has adhered to the nozzle plate, the surface of the nozzle plate is wiped and cleaned by sliding the cleaning blade 466 on the nozzle plate. When the soiling on the ink ejection surface is cleaned away by the blade mechanism, a preliminary ejection is also carried out in order to prevent the foreign matter from becoming mixed inside the nozzle 12 by the blade.

Description of Control System

FIG. 12 is a principal block diagram showing the system configuration of the inkjet recording apparatus 410. The inkjet recording apparatus 410 comprises a communication interface 470, a system controller 472, a memory 474, a motor driver 476, a heater driver 478, a print controller 480, an image buffer memory 482, a head driver 484, and the like.

The communication interface 470 is an interface unit for receiving image data sent from a host computer 486. A serial interface such as USB, IEEE1394, Ethernet, wireless network, or a parallel interface such as a Centronics interface may be used as the communication interface 470. A buffer memory (not shown) may be mounted in this portion in order to increase the communication speed. The image data sent from the host computer 486 is received by the inkjet recording apparatus 410 through the communication interface 470, and is temporarily stored in the memory 474.

The memory 474 is a storage device for temporarily storing images inputted through the communication interface 470, and data is written and read to and from the memory 474 through the system controller 472. The memory 474 is not limited to a memory composed of semiconductor elements, and a hard disk drive or another magnetic medium may be used.

The system controller 472 is constituted by a central processing unit (CPU) and peripheral circuits thereof, and the like, and it functions as a control device for controlling the whole of the inkjet recording apparatus 410 in accordance with a prescribed program, as well as a calculation device for performing various calculations. More specifically, the system controller 472 controls the various sections, such as the communication interface 470, memory 474, motor driver 476, heater driver 478, and the like, as well as controlling communications with the host computer 486 and writing and reading to and from the memory 474, and it also generates control signals for controlling the motor 488 and heater 489 of the conveyance system.

The motor driver (drive circuit) 476 drives the motor 488 in accordance with commands from the system controller 472. The heater driver (drive circuit) 478 drives the heater 489 of the post-drying unit 440 (shown in FIG. 10) or the like in accordance with commands from the system controller 472.

The motor 488 shown in FIG. 12 includes a plurality of motors (motion actuators), such as the motors of movement mechanisms, for instance, the drive motors of the belt suction conveyance unit 422 (see FIG. 10) and the blade 466 (see FIG. 11), and the like. The motor driver 476 for controlling this plurality of motors 488 may be provided in plural fashion so as to correspond to each motor, or all or a portion of the plurality of motor drivers may be composed in an integrated fashion.

Furthermore, the heater 489 shown in FIG. 12 includes a plurality of heaters, such as a heater forming a heat source for the heating fan 440 (see FIG. 10) and a heater used in the post drying unit 442 (see FIG. 10), and the like.

The print controller 480 has a signal processing function for performing various tasks, compensations, and other types of processing for generating print control signals from the image data stored in the memory 474 in accordance with commands from the system controller 472 so as to supply the generated print data to the head driver 484. Prescribed signal processing is carried out in the print controller 480, and the ejection amount and the ejection timing of the ink droplets from the respective heads 412K, 412C, 412M, and 412Y are controlled through the head driver 484.

The print controller 480 is provided with the image buffer memory 482; and image data, parameters, and other data are temporarily stored in the image buffer memory 482 when image data is processed in the print controller 480. The aspect shown in FIG. 12 is one in which the image buffer memory 482 accompanies the print controller 480; however, the memory 474 may also serve as the image buffer memory 482. Also possible is an aspect in which the print controller 480 and the system controller 472 are integrated to form a single processor.

The head driver 484 generates drive signals on the basis of print data supplied by the print controller 480 and drives the actuators 28 (see FIG. 2) of the print heads of the respective colors, 412K, 412C, 412M and 412Y, by means of these drive signals. A feedback control system for maintaining constant drive conditions in the head may be included in the head driver 484.

In other words, the image data to be printed is input through the communications interface 470 from an external source (for example, a host computer 486), and is stored in the memory 474. At this stage, RGB image data is stored in the memory 474.

The image data stored in the memory 474 is sent to the print controller 480 through the system controller 472, and is converted to the dot data for each ink color in the print controller 480. In other words, the print controller 480 performs processing for converting the inputted RGB image data into dot data for four colors, K, C, M and Y. The dot data generated by the print controller 480 is stored in the image buffer memory 482.

In the present embodiment, a memory 474 is shown as a storage unit attached to the system controller 472, but the memory 474 may also be constituted by a plurality of memories (storage media). Furthermore, it is also possible to incorporate the memory into the system controller 472. The information stored in the memory 474 may include, in addition to the RGB image data described above, various setting information, system parameters, a threshold value table used to judge conditions, various types of data tables, corrective coefficients used for various corrections, and the like.

Various control programs are stored in a program storage section 490, and a control program is read out and executed in accordance with commands from the system controller 472. The program storage section 490 may use a semiconductor memory, such as a ROM, EEPROM, or a magnetic disk, or the like. An external interface may be provided, and a memory card or PC card may also be used. Naturally, a plurality of these storage media may also be provided.

The program storage unit 490 may also be combined with a storage device (memory) (not shown) for storing operational parameters (system parameters), and the like.

The print determination unit 424 is a block that includes the line sensor as described above with reference to FIG. 10, reads the image printed on the recording medium 416, determines the ejection conditions (presence of the ejection, variation in the dot formation, and the like) by performing required signal processing, or the like, and provides the determination results of the ejection conditions to the print controller 480.

According to requirements, the print controller 480 makes various corrections with respect to the heads 412K, 412C, 412M, and 412Y on the basis of information obtained from the print determination unit 424.

In the foregoing embodiment, an inkjet recording apparatus 410 using page-wide full line type heads 412K, 412C, 412M and 412Y having nozzle rows of a length corresponding to the entire width of the recording medium 416 is described, but the scope of application of the present invention is not limited to this, and the present invention may also be applied to an inkjet recording apparatus using a shuttle head which performs image recording while moving a recording head of short dimensions, in a reciprocal fashion.

The foregoing embodiments described an inkjet recording apparatus 410 for forming images on the recording medium 416 by ejecting ink from nozzles 12 provided in the head (inkjet head) 10, but the scope of application of the present invention is not limited to this, and it may also be applied broadly to image forming apparatuses which form images (three-dimensional shapes) by means of a liquid other than ink, such as resist, or to liquid ejection apparatuses, such as dispensers, which eject liquid chemicals, water, or the like, from nozzles (ejection holes).

It should be understood, however, that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A method of manufacturing a wiring substrate, comprising:
    a recess section forming step of forming recess sections corresponding to a prescribed wiring pattern, on a substrate;
    a filling step of filling a conductive paste containing thinner, into the recess sections;
    a curing step of causing the conductive paste filled in the recess sections in the filling step to contract, by drying and curing; and
    a plating step of forming a wiring conductor serving as the wiring pattern, by performing a plating process using the conductive paste in contact with at least a portion of an inner circumferential face of the recess sections, as at least one of a catalyst and a current feed layer.

2. The method as defined in claim 1, wherein, in the recess section forming step, the recess sections are integrally cast with the substrate when the substrate is cast from resin by using a mold.

3. The method as defined in claim 1, wherein in the plating step, the plating process is an electrolytic plating process in which the conductive paste having been dried and cured in the curing step is used as the current feed layer, and the wiring conductor having specific resistance of not higher than 2 Ω·cm is formed.

4. The method as defined in claim 1, wherein in the plating step, the plating process is an electroless plating process in which the conductive paste having been dried and cured in the curing step is used as the catalyst, and the wiring conductor having specific resistance of not lower than 2 Ω·cm and not higher than 3 Ω·cm is formed.

5. The method as defined in claim 4, wherein in the filling step, the conductive paste containing metallic filler is filled into the recess sections.

6. The method as defined in claim 1, wherein:
    in the curing step, a recess portion is formed on the conductive paste; and
    in the plating step, the wiring conductor is formed in the recess portion on the conductive paste formed in the curing step.

7. A method of manufacturing a liquid ejection head, comprising:
    a flow channel structure body forming step of forming a flow channel structure body having nozzles which eject liquid, pressure chambers which accommodate the liquid to be ejected from the nozzles, flow channels through which the liquid flows, and ejection force generating devices which apply ejection force to the liquid accommodated in the pressure chambers;
    a wiring substrate forming step of forming a wiring substrate which has a prescribed wiring pattern corresponding to the ejection force generating devices, the wiring substrate forming step including:
        a recess section forming step of forming recess sections corresponding to the prescribed wiring pattern, on the wiring substrate;
        a filling step of filling a conductive paste containing thinner, into the recess sections;
        a curing step of causing the conductive paste filled in the recess sections in the filling step to contract, by drying and curing; and
        a plating step of forming a wiring conductor serving as the wiring pattern, by performing a plating process using the conductive paste in contact with at least a portion of an inner circumferential face of the recess sections, as at least one of a catalyst and a current feed layer; and a connecting step of connecting the flow channel structure body and the wiring substrate.

8. The method as defined in claim 7, wherein in the plating step, the plating process is an electrolytic plating process in which the conductive paste having been dried and cured in the curing step is used as the current feed layer, and the wiring conductor having specific resistance of not higher than 2 Ω·cm is formed.

9. The method as defined in claim 7, wherein in the plating step, the plating process is an electroless plating process in which the conductive paste having been dried and cured in the curing step is used as the catalyst, and the wiring conductor having specific resistance of not lower than 2 Ω·cm and not higher than 3 Ω·cm is formed.

10. The method as defined in claim 9, wherein in the filling step, the conductive paste containing metallic filler is filled into the recess sections.

11. The method as defined in claim 7, wherein:

in the curing step, a recess portion is formed on the conductive paste; and in the plating step, the wiring conductor is formed in the recess portion on the conductive paste formed in the curing step.

\* \* \* \* \*